(12) United States Patent
Jacquet et al.

(10) Patent No.: US 8,033,550 B2
(45) Date of Patent: Oct. 11, 2011

(54) PISTON RING HAVING HARD MULTI-LAYER COATING

(75) Inventors: Jean-Marie Jacquet, Le-Palais-sur-Vienne (FR); Frederick G. Wietig, East Aurora, NY (US)

(73) Assignee: Sulzer Metaplas GmbH, Bergisch Gladbach (DE)

( * ) Notice: Subject to any disclaimer, the term of this patent is extended or adjusted under 35 U.S.C. 154(b) by 486 days.

(21) Appl. No.: 11/915,246

(22) PCT Filed: Mar. 1, 2006

(86) PCT No.: PCT/EP2006/060346
§ 371 (c)(1),
(2), (4) Date: Dec. 27, 2007

(87) PCT Pub. No.: WO2006/125683
PCT Pub. Date: Nov. 30, 2006

(65) Prior Publication Data
US 2008/0203674 A1    Aug. 28, 2008

(30) Foreign Application Priority Data
May 26, 2005    (EP) .................................... 05104517

(51) Int. Cl.
*F16J 9/26* (2006.01)

(52) U.S. Cl. ........ 277/442; 427/577; 428/212; 428/408; 428/698

(58) Field of Classification Search .................. 277/442; 428/212, 408, 698; 427/577
See application file for complete search history.

(56) References Cited

U.S. PATENT DOCUMENTS

| | | | | |
|---|---|---|---|---|
| 5,743,535 | A  * | 4/1998 | Hodgins | 277/434 |
| 6,139,022 | A  * | 10/2000 | Iwashita et al. | 277/442 |
| 6,142,481 | A | 11/2000 | Iwashita et al. | |
| 6,228,471 | B1 * | 5/2001 | Neerinck et al. | 428/212 |
| 6,279,913 | B1 | 8/2001 | Iwashita et al. | |
| 6,325,385 | B1 * | 12/2001 | Iwashita et al. | 277/442 |
| 7,160,616 | B2 * | 1/2007 | Massler et al. | 428/408 |
| 2006/0182895 | A1 * | 8/2006 | Denul et al. | 427/588 |

FOREIGN PATENT DOCUMENTS

| | | | |
|---|---|---|---|
| DE | 3702242 | * | 9/1987 |
| DE | 296 05 666 U1 | | 5/1996 |
| EP | 0 856 592 A1 | | 8/1998 |
| EP | 0 963 455 B1 | | 12/1999 |
| EP | 0 988 406 B1 | | 3/2000 |
| EP | 0 905 420 B1 | | 5/2003 |
| JP | 05-179451 | * | 7/1993 |
| WO | 00-75396 | * | 12/2000 |
| WO | 2004-088113 | * | 10/2004 |
| WO | WO 2005/014882 A1 | | 2/2005 |
| WO | WO 2005/054539 A1 | | 6/2005 |

* cited by examiner

*Primary Examiner* — Archene Turner
(74) *Attorney, Agent, or Firm* — Foley & Lardner LLP

(57) ABSTRACT

A piston ring (22) is covered at least partially with a layered structure (30). The layered structure (30) comprises: —a first intermediate layer (32) comprising at least one element of group IVB, group VB or group VIB; —a second intermediate layer (34) deposited on top of the first intermediate layer (32) and comprising a diamond-like nanocomposite composition; —a diamond-like carbon layer (36) deposited on top of the second intermediate layer (34).

12 Claims, 1 Drawing Sheet

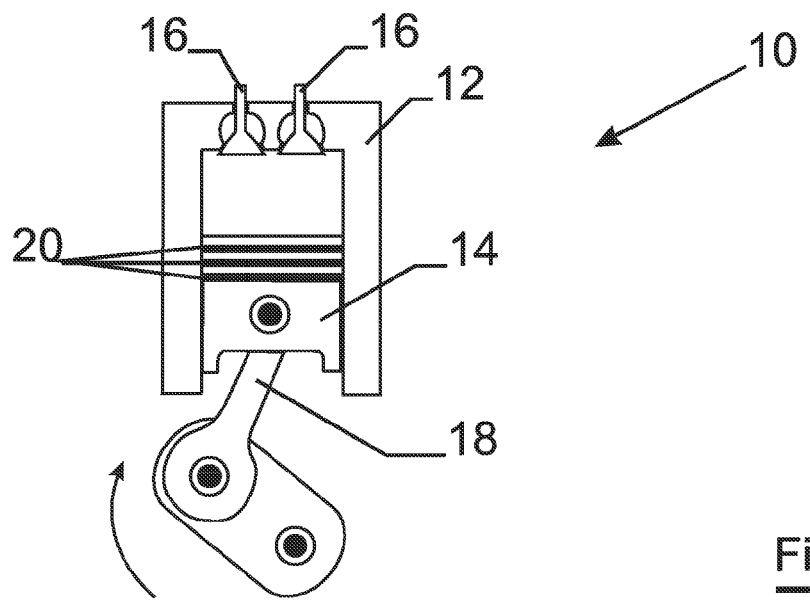
Fig. 1
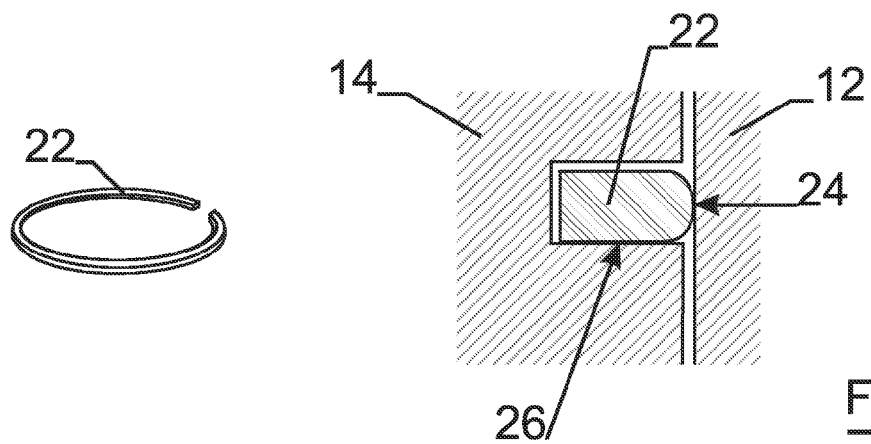
Fig. 2
Fig. 3
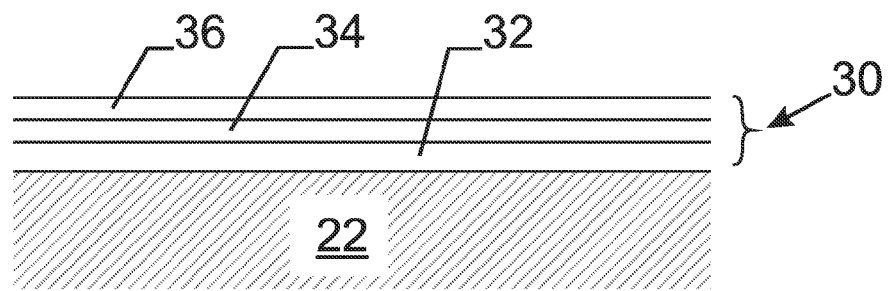
Fig. 4

PISTON RING HAVING HARD MULTI-LAYER COATING

FIELD OF THE INVENTION

The invention relates to a piston ring covered at least partially with a layered structure.

The invention further relates to a piston with one or more such piston rings and to a method to cover a piston ring with such a layered structure.

BACKGROUND OF THE INVENTION

Piston rings are open-ended rings which fit into a groove on the outer diameter of a piston of an internal combustion motor.

Piston rings are expected to fulfill a lot of severe demands.

First of all piston rings must provide a seal between the piston and the cylinder wall.

Secondly piston rings must minimize the blow-by, i.e. the amount of combustion gas that seeps the piston rings.

Thirdly piston rings must harness the full power of the combustion stroke.

As a fourth requirement, piston rings must scrape off the oil from the cylinders in order to prevent contamination of the combustion process.

A fifth requirement is that the piston ring must regulate the heat transfer from the piston to the cylinder wall.

As a sixth requirement the piston ring must control the thermal changes in the engine.

A seventh requirement is that the piston ring must regulate the oil consumption of the internal combustion motor.

Having regards to these different requirements, the design of a piston ring is driven by several demands which may be often contradictory. Some of these demands are reduced oil consumption, lower friction, higher power output, longer life, decreased variability, reduced exhaust emissions and low cost.

Existing piston ring designs originate from standards developed by engine and ring manufacturers based on tests and data gathered over a very long period of time. Piston ring properties are chosen utilizing a particular combination of the piston ring material, the coating on the piston ring, and the geometry of the piston ring.

The present invention relates to the coating aspect on the piston ring.

Prior art documents U.S. Pat. No. 6,142,481, U.S. Pat. No. 6,279,913 and DE-U1-296 05 666 all disclose various diamond-like carbon coatings on piston rings.

The present invention provides an alternative coating giving an improvement over existing diamond-like carbon coatings on piston rings, more particularly with respect to reduction of friction and to surface coverage and corrosion protection.

SUMMARY OF THE INVENTION

It is an object of the present invention to avoid the drawbacks of the prior art.

It is also an object of the present invention provide on a piston ring a layered structure comprising a DLC coating having an improved adhesion to a substrate.

It is a further object to provide a piston ring covered with a structure having an improved surface coverage.

It is yet another object of the present invention to extend the life time of a piston ring.

It is still another object of the present invention to increase the reliability of piston rings.

It is further one of the main objects of the present invention to reduce the friction losses while maintaining a high level of hardness.

According to a first aspect of the invention, there is provided a piston ring which is at least partially covered with a layered structure.

The layered structure comprises
 a first intermediate layer, having at least one element of group IVB, VB or VIB;
 a second intermediate layer deposited on the first intermediate layer; the second intermediate layer has a diamond-like nanocomposite (DLN) composition;
 a diamond-like carbon (DLC) layer, deposited on said second intermediate layer.

This structure of at least three layers, as such, is disclosed in pending application PCT/EP03/50923 of applicant. The three layers of the application will now be described in more detail.

The First Intermediate Layer

The first intermediate layer comprises at least one element of the group IVB, VB or VIb.

Preferably, the first intermediate layer comprises titanium and/or chromium as for example a titanium layer, a chromium layer, a titanium-based layer or a chromium-based layer.

A titanium-based layer may for example comprise a TiC layer, a TiN layer or a TiCN layer. A chromium-based layer may for example comprise a CrN layer or a $Cr_3C_2$ layer.

A titanium-based layer may be preferred to a chromium-base layer as it is sometimes easier to rework or refurbish layered structures comprising a titanium-based layer.

For example, a reactive ion etching used to decoat will not work with a chromium-based interlayer.

The thickness of the first intermediate layer is preferably between 0.001 and 1 µm. More preferably, the thickness of the first intermediate layer is between 0.1 and 0.5 µm.

The first intermediate layer may be deposited by any technique known in the art. Preferred techniques comprise physical vapor deposition techniques as sputtering or evaporating.

The Second Intermediate Layer

The second intermediate layer comprises a diamond-like nanocomposite composition.

A diamond-like nanocomposite composition is disclosed e.g. in EP-A-0 988 406.

A diamond-like nanocomposite composition comprises an amorphous structure of C, H, Si and O. Generally, DLN coatings comprise two interpenetrating networks a-C:H and a-S:O. DLN coating are commercially known as DYLYN® coatings.

Preferably, the nanocomposite composition comprises in proportion to the sum of C, Si, and O: 40 to 90% C, 5 to 40% Si, and 5 to 25% O (expressed in at %).

Preferably, the diamond-like nanocomposite composition comprises two interpenetrating networks of a-C:H and a-Si:O.

The diamond-like nanocomposite coating may further be doped with a metal, such as a transition metal of Group IV to VII. The coating can be doped to influence the conductivity of the coating. W, Zr and Ti are for example well suited as doping element.

The second intermediate layer has a thickness which is preferably between 0.01 and 5 µm. More preferably, the thickness is between 0.1 and 1 µm, for example between 0.2 and 0.5 µm.

The second intermediate layer may be deposited by any technique known in the art. A preferred technique comprises chemical vapor deposition (CVD), such as plasma assisted chemical vapor deposition (PACVD).

Diamond-Like Carbon Coating

The diamond-like carbon coating comprises amorphous hydrogenated carbon (a-C:H).

Preferably, a diamond-like carbon coating comprises a mixture of $sp^2$ and $sp^3$ bonded carbon with a hydrogen concentration between 0 and 60 at %.

The DLC coating may be metal doped, for example to influence the electrical conductivity of the coating. Preferred doping elements are transition metals of Group IV to VII such as W, Zr and Ti.

The thickness of the DLC coating is preferably between 0.1 and 10 µm.

The DLC coating may be deposited by any technique known in the art. A preferred technique comprises chemical vapor deposition (CVD), such as plasma assisted chemical vapor deposition (PACVD).

Although the applicant does not want to be bound to any theory, it is believed that the gradation of the hardness of the layers is important to obtain the good results of a layered structure according to the present invention.

In the case a titanium layer is used as intermediate layer for a DLC coating, there is a soft substrate with a layer of soft Ti. DLC deposited on such a stack is prone to puncturing.

In the layered structure according to the present invention comprising a first intermediate layer and a second intermediate layer comprising DLN, the second intermediate layer provides extra support.

Furthermore, the second intermediate layer, having a hardness in between the hardness of the first intermediate layer and the hardness of the DLC coating, provides a cushioning effect.

Possibly, the layered structure according to the present invention further comprises one or more additional layers as for example a layer comprising a diamond-like nanocomposite composition on top of the diamond-like carbon layer.

A stack of one or more combination layers of a diamond-like nanocomposite composition and a diamond-like carbon layer is disclosed in EP-A-0 963 455.

In another embodiment, the layered structure further comprises a diamond-like nanocomposite layer on top of the diamond-like carbon layer and a diamond-like carbon layer on top of the diamond-like nanocomposite layer.

It is clear for a person skilled in the art that the number of the additional layers can be varied according to the desired properties of the layered structure.

The top layer of the layered structure can be chosen depending on the desired properties of the layered structure and depending on the application.

When a DLC layer is deposited on top of the layered structure, the hardness and low-wear characteristics, typical for a DLC type coating prevail. This implies that by depositing a DLC layer on top of the layered structure a high wear and abrasion resistance coating is obtained. Thicknesses higher than these of conventional DLC coatings can be deposited in this way.

In the case a DLN coating is deposited as top layer, the layered structure is characterized by a low surface energy and by a low friction coefficient. Such a layered structure is in particular suitable as non-sticking coating.

A great advantage of the layered structure that forms the coating on the piston ring, is the high corrosion protection that may be obtained because of the good surface coverage.

The surfaces of the substrate that are not coated or not coated well with the first intermediate coating because they are not exposed to the beam of atom(s) of group IVB, group VB or group VIB will be protected by the second intermediate layer and the diamond-like carbon layer.

Another advantage of the layered structure that forms the coating on the piston ring, is a very low coefficient of friction in combination with a high hardness and an excellent adhesion. This reduced friction results in a higher engine output and an improved fuel consumption.

The piston ring according to the invention may either be a piston ring of cast iron or a piston ring of cold worked steel, e.g. high carbon steel. In the latter case a high carbon steel wire is drawn until an intermediate diameter and thereafter rolled until the desired cross-section is obtained. The steel wire may have been subjected to a surface hardening treatment such as a nitriding treatment.

According to a second aspect of the invention, a method to cover a piston ring with a layered structure is provided.

The method comprises the steps of
providing a piston ring;
applying a first intermediate layer; this first intermediate layer comprises at least one element of group IVB, group VB or group VIB, such as titanium and/or chromium;
applying a second intermediate layer; this second intermediate layer comprises a diamond-like nanocomposite composition;
applying a diamond-like carbon layer.

If desired, the deposition of the first intermediate layer may be completely stopped before the application of the second intermediate layer. In this way a reproducible transition between the layers can be obtained.

According to a third aspect of the present invention, there is provided a piston having three grooves and having three piston rings fitting into said grooves. At least one of the three piston rings is a piston ring according to the first aspect of the present invention, i.e. a piston ring covered at least partially with a multi-layer coating as described above.

BRIEF DESCRIPTION OF THE DRAWINGS

The invention will now be described with reference to the accompanying drawings wherein:

FIG. 1 schematically shows a cylinder and piston assembly;

FIG. 2 shows a perspective view of a piston ring;

FIG. 3 shows a cross-section of the working of a piston ring in a cylinder and piston assembly;

FIG. 4 shows in cross-section a layered structure as coating on a piston ring.

DESCRIPTION OF THE PREFERRED EMBODIMENTS OF THE INVENTION

FIG. 1 shows schematically a cylinder and piston assembly 10. A cylinder 12 is housing a piston 14. A mixture of fuel and air is fed through a valve 16. Internal combustion of this fuel/air mixture moves cylinder 14. Cylinder 14 is connected via a connecting rod 18 to other moving components of an internal combustion engine. Three piston rings 20 fit into three grooves on the external diameter of the piston 14.

The upper ring, called the compression ring, is closest to the combustion and plays an important role in ensuring proper compression.

The middle ring, called lubricating ring, usually provides lubrication to the upper ring and reinforces the working of both the upper ring and the bottom ring.

The bottom ring, called oil scraping ring, is closest to the oil chamber and is taking care of the removal of oil residue.

FIG. 2 shows a perspective view of a piston ring 22. The cross-section of this piston ring is usually non-round. The DIN ISO 6621-6626 standards list various types of cross-sections of the piston rings.

FIG. 3 shows in cross-section the working of a piston ring 22 in a cylinder-piston assembly. Piston ring 22 is fitting in a groove of piston 14. The piston ring shown has a generally flat cross-section with a rounded side 24 that is pointing towards and in contact with the cylinder wall.

All the side surfaces of the piston ring may be coated with the layered structure as described.

Alternatively, only the rounded side 24 can be covered with the layered structure. This is because this rounded side is in sliding contact with the cylinder wall.

As a second preferred alternative or in addition, the under side 26 can be covered with the layered structure. Coating of the under side 26 is done in order to avoid adhesion between the piston ring 22 and the groove of the piston. It is hereby understood that the piston 14 is usually made of a silicon containing aluminum or steel and that adhesion may be likely between the aluminum or steel of the piston 14 and the steel or iron of the piston ring 22. The avoidance of this adhesion is an important aspect of the present invention.

FIG. 4 gives a cross-section of part of a piston ring 22 covered with the layered structure 30. A first intermediate layer 32 comprising titanium is deposited on piston ring 22. A second intermediate layer 34 comprising DLN is deposited on the first intermediate layer 32. A diamond-like carbon (DLC) coating 36 forms the top coating above the second intermediate layer 34.

The characteristics of three different coating types are compared. The coating types are deposited on a hardened steel substrate.

The three coating types are subjected to a Rockwell adhesion test and to a scratch adhesion test.

a) The first coating type comprises a layered structure of a DLN layer and a DLC layer deposited on top of this DLN layer;

b) The second coating type comprises a layered structure of a titanium layer and a DLC layer deposited on top of this titanium layer. The composition of the titanium layer is gradually changed from a titanium layer to a DLC layer.

c) The third coating type comprises a layered structure according to the present invention. This layered structure comprises a titanium layer, a DLN layer deposited on top of the titanium layer and a DLC layer deposited on top of the DLN layer. There is no gradient between the titanium and the DLN layer, whereas the DLN layer is gradually changing to a DLC layer.

The adhesion of the second and third coating type measured by means of the Rockwell C indentation test is better than the adhesion of the first coating type.

The HF value for the first coating type is HF 3-5. For the second coating type a HF value 1-3 is measured, whereas for the third coating type a HF value 1-3 is measured.

The critical load to obtain delamination in a scratch adhesion test is for the third coating type between 22 and 35 N. For the first coating type a critical load between 15 and 30 N is obtained; for the second coating type a critical load between 15 and 27 N is obtained. Comparison of the scratch adhesion of the different coatings indicates that the third coating type gives the best $Lc_2$-values.

A coating of the first type does not perform well in high shear and high impact loading applications.

A coating of the second type performs slightly better under high impact loading. However, under high shear loading there is possibility of wear and coating removal.

A coating of the third type performs very well under both high impact and high shear applications.

The table hereunder summarizes values measured on the three-layered structure coating of a piston ring. The global coating thickness ranges from 1 μm to 5 μm and the deposition temperature is below 200° C.

TABLE

| Coefficient of friction | 0.05-0.10 | (1) |
|---|---|---|
| Hardness (GPa) | 15-20 | (2) |
| Adhesion - Lc2 value (Newton) | >25 | (3) |
| Adhesion - HF value | 1-2 | (4) |
| E-modulus (GPa) | 150-250 | (5) |

(1) coefficient of friction is measured by means of a steel-ball-on-disc test in dry circumstances: 10 Newton, 0.17 m/s, 25° C., 50% relative humidity, 100 000 cycles
(2) nano indentation
(3) scratch test: constant load on HSS (M2) substrate
(4) Rockwell C on HSS (M2) according to VDI 3198
(5) nano indentation The obtained coefficient of friction is clearly below a comparable coefficient of friction of other prior art coatings. Typical CrN coatings have a coefficient of friction ranging from 0.40 to 0.50. A prior art DLC coating has a coefficient of friction ranging from 0.10 to 0.20.

Therefore friction losses can be substantially reduced, which results, amongst other, in a reduced consumption.

The three-layered structure uniquely combines a low friction with a high hardness.

The invention claimed is:

1. A piston ring covered at least partially with a layered structure, said layered structure comprising:
    a first intermediate layer, said first intermediate layer being selected from the group consisting of titanium, chromium, TiC, TiN, TiCN, CrN and $Cr_3C_2$;
    a second intermediate layer deposited on top of said first intermediate layer, said second intermediate layer comprising a diamond-like nanocomposite composition; and
    a diamond-like carbon layer deposited on top of said second intermediate layer;
    wherein the first intermediate layer is deposited directly onto the piston ring, the second intermediate layer is deposited directly onto the first intermediate layer, and the diamond-like carbon layer is deposited directly onto the second intermediate layer.

2. A piston ring as claimed in claim 1, wherein said structure further comprises at least a layer comprising a diamond-like nanocomposite composition on top of said diamond-like carbon layer.

3. A piston ring as claimed in claim 1 wherein said first intermediate layer has a thickness between 0.001 and 1 μm.

4. A piston ring as claimed in claim 1 wherein said second intermediate layer has a thickness of 0.01 to 5 μm.

5. A piston ring as claimed in claim 1, wherein said diamond-like carbon layer has a thickness between 0.1 and 10 μm.

6. A piston ring as claimed in claim 1, wherein said nanocomposite composition comprises in proportion to the sum of C, Si, and O in at %40 to 90% C, 5 to 40% Si, and 5 to 25% O.

7. A piston ring as claimed in claim 1 wherein said second intermediate layer comprises a metal doped diamond-like nanocomposite composition.

8. A piston ring as claimed in claim 1, wherein said diamond-like carbon layer is doped with a metal.

9. A piston ring as claimed in claim 1, wherein said piston ring comprises cast iron.

10. A piston ring as claimed in claim 1, wherein said piston ring comprises cold worked carbon steel.

11. A method to cover a piston ring as claimed in claim 1 with a layered structure, wherein said method comprises the steps of:
- providing a piston ring;
- applying a first intermediate layer directly onto the piston ring, said first intermediate layer being selected from the group consisting of titanium, chromium, TiC, TiN, TiCN, CrN and $Cr_3C_2$;
- applying a second intermediate layer directly onto the first intermediate layer, said second intermediate layer comprising a diamond-like nanocomposite composition; and
- applying a diamond-like carbon layer directly onto the second intermediate layer.

12. A piston having three grooves and having three piston rings fitting into said grooves, at least one of said piston rings being a piston ring as claimed in claim 1.

* * * * *